US005286933A

United States Patent [19]

Pham

[11] Patent Number: 5,286,933

[45] Date of Patent: Feb. 15, 1994

[54] VACUUM CIRCUIT-BREAKER EQUIPPED WITH SELF-DIAGNOSIS MEANS

[75] Inventor: Van Doan Pham, Meyzieu, France

[73] Assignee: GEC Alsthom SA, Paris, France

[21] Appl. No.: 977,295

[22] Filed: Nov. 16, 1992

[30] Foreign Application Priority Data

Nov. 22, 1991 [FR] France ................................ 91 14396

[51] Int. Cl.[5] ..................... G01L 21/30; G01R 31/32; H01H 33/26

[52] U.S. Cl. ............................ 200/144 B; 200/144 R; 324/424; 324/460

[58] Field of Search ........................ 200/144 R, 144 B; 324/409, 424, 460

[56] References Cited

U.S. PATENT DOCUMENTS 4,345,153 8/1982 Yin ...................................... 250/369

4,906,935 3/1990 Hess et al. ............................ 324/409

OTHER PUBLICATIONS

Journal of Lightwave Technology, vol. 7, No. 7, Jul. 1989, New York, US; pp. 1029–1032; Katsutoshi Muto: "Electric-Discharge Sensor Utilizing Fluorescent Optical Fiber".

Nuclear Instruments and Methods in Physics Research, No. 257, 1987, Amsterdam, Netherlands, pp. 603–606; Blumenfeld et al: "Plastic Fiberes in High Energy Physics".

Patent Abstracts of Japan, vol. 14, No. 452 (P-1112)(4395) Sep. 27, 1990 & JP-A-2 181 668 (Furukawa Electric Co.) Jul. 16, 1990.

*Primary Examiner*—Jeffrey A. Gaffin
*Assistant Examiner*—Michael A. Friedhofer
*Attorney, Agent, or Firm*—Sughrue, Mion, Zinn, Macpeak & Seas

[57] ABSTRACT

A vacuum circuit-breaker including, for each phase, at least one vacuum bottle housed inside a closed enclosure, wherein said circuit-breaker includes at least one scintillation fiber disposed in the space between said enclosure and the outside surface of the vacuum bottle(s), said fiber being connected outside the circuit-breaker to an opto-electronic device.

16 Claims, 3 Drawing Sheets

VACUUM CIRCUIT-BREAKER EQUIPPED WITH SELF-DIAGNOSIS MEANS

The present invention relates to a vacuum circuit-breaker equipped with self-diagnosis means.

BACKGROUND OF THE INVENTION

French Patent No. 90 13,049 mentions using fluorescent plastic optical fibers for detecting the durations of arcing in circuit-breakers using gas, in particular sulfur hexafluoride ($SF_6$).

By observing arcing durations, changes in the state of the apparatus can be assessed, and maintenance work can be planned.

Vacuum circuit-breakers require near-perfect gas-tightness. They are made gastight once and for all in the factory. It is therefore impossible to re-evacuate them at a later stage. Their casings are often made of ceramic, and are therefore opaque, thus making it difficult to inspect the state of the circuit-breaker visually.

A known method of verifying the internal state of the circuit-breaker is to measure its electron emission or ionization threshold, sometimes via an external magnetic field.

In practice, such inspection is performed during a scheduled period of maintenance.

The state of the apparatus is therefore not monitored continuously.

It is well known that, in the presence of a sufficient voltage, a vacuum circuit-breaker emits X-rays while it is being closed, or while it is being opened.

To this end, reference is made to the article entitled "Limiting X-radiation from a high voltage vacuum interrupter at the prebreakdown stage", by W. GORCZEWSKI, report 34-01, 7th International Symposium on High Voltage Engineering, DRESDEN, August 1991.

The X-rays emitted while a vacuum "bottle" is opening or closing are relatively low-level. Protective devices are provided to render them harmless.

It is also known to use scintillation optical fibers for detecting radiation from particles in high-energy accelerators.

For example, reference is made to the article "Organic Scintillators with large Stokes shifts", The Journal of Physical Chemistry, vol. 82, No. 4, 1978, or to the article "Plastic fibers in high energy physics" by M. Blumenfeld, NIM, 257 (1987).

Scintillation fibers pick up radiation via their peripheries and transform it into a light wave passing along the fiber.

The level of X-radiation depends essentially on the voltage applied, the distance between the contacts, the material, the state of the contacts, and the state of the vacuum. Loss of vacuum considerably reduces X-radiation. Therefore, the absence of X-rays, after the circuit-breaker has been operating for a certain length of time, may indicate a loss of vacuum. In the same way, a change in the spectrum of the radiation recorded may signify that there has been an operating change in the inter-electrode space, e.g. the contacts have been eroded.

As explained below, it was the Applicant who thought of using scintillation fibers to obtain continuous and effective monitoring of a circuit-breaker including vacuum bottles by measuring the vacuum inside the bottles.

This use makes it possible to solve the specific problems that arise, namely the following:

the measuring means used must withstand the voltage existing between the terminals of the vacuum bottles (in the range 6 kV to 72 kV);

it must be possible to measure the vacuum without taking the circuit-breaker apart;

the measuring means used must be compact, so as to be housed as close as possible to the vacuum bottle, because the X-radiation from a vacuum bottle is low-level;

the response time must be short; and the measuring means must be cheap, and in particular must make it possible to use cheap components, such as photo-diodes.

These objects cannot be achieved by the apparatus described in Document EP-A-0,309,852 which advocates using a Geiger-Moller counter.

SUMMARY OF THE INVENTION

The invention provides a vacuum circuit-breaker including, for each phase, at least one vacuum bottle housed inside a closed enclosure, said circuit-breaker further including at least one scintillation fiber disposed in the space between said enclosure and the outside surface of the vacuum bottle(s), said fiber being connected outside the circuit-breaker to an opto-electronic device.

In a first embodiment of the invention, the circuit-breaker includes at least one scintillation fiber per phase.

In another embodiment of the invention, the scintillation fiber is common to all three phases.

In circuit-breakers providing sufficient X-radiation, the scintillation fiber is wound around the central portion of the vacuum bottle, a first end of the fiber being left free, and the other end going out of the enclosure.

In circuit-breakers providing very strong X-radiation, the scintillation fiber merely hangs down inside the space between the enclosure and the vacuum bottle.

When the scintillation fiber is common to the various phases of the circuit-breaker, the scintillation fiber is disposed so that it defines a U-shaped loop around each vacuum bottle.

When the casing of the vacuum bottles is made of a material that is transparent or translucent, the scintillation fiber is covered with a sheath making it opaque to visible radiation, and the circuit-breaker further includes a fluorescent optical fiber.

The scintillation fiber is then disposed around the central portion of the vacuum bottle, the fluorescent fiber being wound around the vacuum bottle at one end thereof.

In a variant, at least one of the fibers is disposed so that it hangs down.

Advantageously, the opto-electronic device is connected to the optical fiber of the circuit-breaker via an optical fiber made of silica or of plastic.

Preferably, the opto-electronic device is a photo-diode.

Either the casing is made of an insulating material and the space between the casing and the vacuum bottle is filled with air, or else the casing is made of metal, and the space between the casing and the vacuum bottle is filled with a gas having good dielectric properties, such as sulfur hexafluoride.

The optical fiber used is cylindrical or in the form of a strip or a film.

In a variant, the vacuum bottle is surrounded by a cylinder constituted by a scintillation film, with a fluorescent fiber connected to a photo-detector being wound around said cylinder.

In another variant, the circuit-breaker includes a plurality of scintillation fibers disposed in parallel to form a cylinder that is coaxial with the vacuum bottle, and a fluorescent fiber disposed to form a collar at one end of said cylinder and facing the ends of said scintillation fibers, one end of said fluorescent fiber being connected to a photo-detector. In which case, said scintillation fibers are preferably glued to a transparent tube.

BRIEF DESCRIPTION OF THE DRAWINGS

Embodiments of the invention are described by way of example with reference to the accompanying drawings, in which.

DETAILED DESCRIPTION

The embodiments described with reference to FIGS. 1 to 6 concern circuit-breakers in which the vacuum bottles are placed in an enclosure made of an insulating material, the space between the bottles and the wall of the enclosure being filled with air. The invention also applies to circuit-breakers in which the vacuum bottles are placed inside a metal enclosure, the space between the bottles and the wall of the enclosure being filled with a gas having good dielectric properties, such as sulfur hexafluoride.

Figure 1:
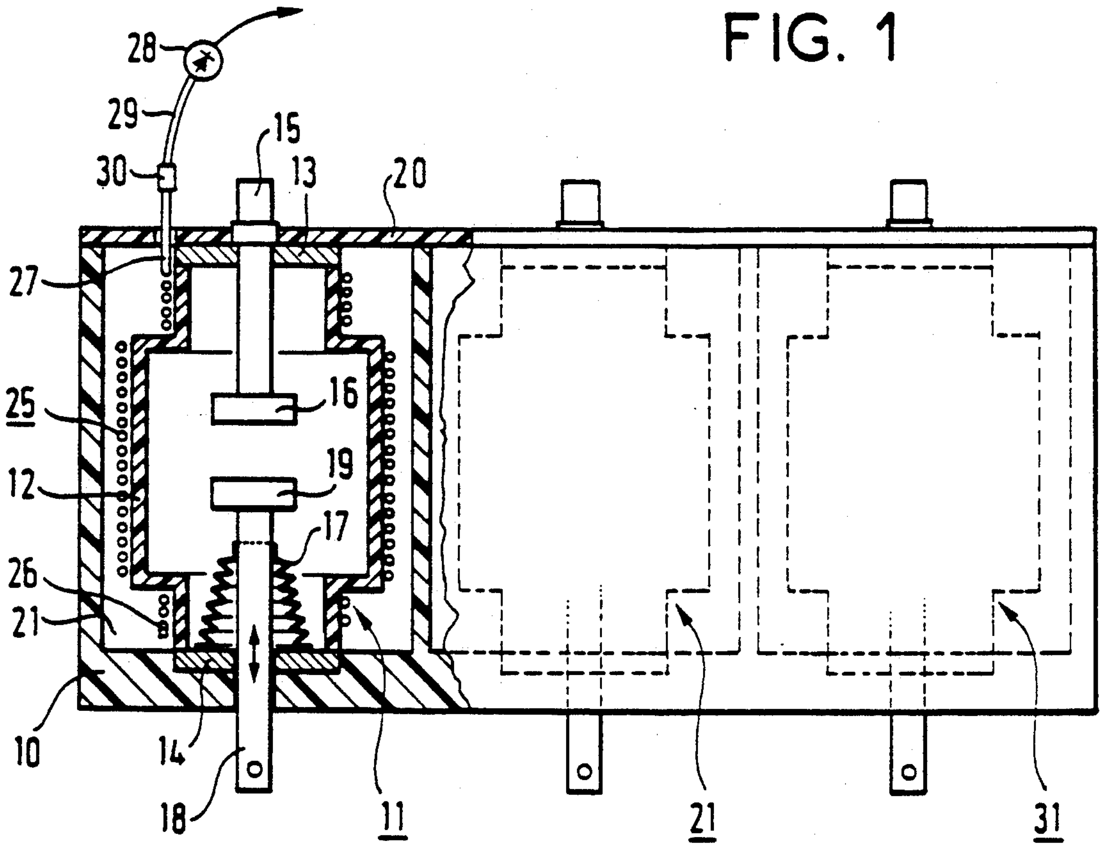
FIG. 1 is a partially cut-away fragmentary diagrammatic elevation view of a three-phase vacuum circuit-breaker in a first embodiment.

In FIG. 1, reference 10 designates an enclosure made of an insulating material such as molded epoxy resin, which enclosure contains and protects three identical vacuum bottles 11, 21, and 31 constituting the three poles of a three-phase circuit-breaker. Since the three bottles are identical, only one bottle 11 is described in detail.

The vacuum bottle 11 comprises a casing 12, e.g. made of ceramic. The casing is closed at both ends by metal caps 13 and 14, and the vacuum is provided inside the casing.

Cap 13 is connected outside the casing to a first current terminal 15 of the pole, and, inside the casing, to a fixed contact 16 of the vacuum bottle.

A moving rod 18 passes through cap 14 in gastight manner by means of a metal bellows 17. The moving rod is connected mechanically to a drive device (not shown) for driving the circuit-breaker, and electrically to a second current terminal of the pole. Inside the casing, the rod 18 carries a moving contact 19.

The way that a vacuum bottle operates is well known, and it is merely recalled that, when the circuit-breaker is in the closed position, the contacts 16 and 17 are pressed together, with current passing via the rod 18, the contact 19, the contact 16, the cap 13, and the current terminal 15.

On circuit-breaker opening, the moving rod 18 is driven down towards the bottom of the figure, together with the identical rods of the other poles.

The arc which is created between the contacts 16 and 19 is extinguished quickly because of the vacuum inside the casing.

An insulating cover 20 closes the enclosure.

The unlighted empty space 21 between the enclosure 10 and the casing 12 of the vacuum bottle is filled with air at atmospheric pressure.

In accordance with a characteristic of the invention, a scintillation optical fiber 25 is housed in the space 21. In practice, the fiber must be long enough to make the apparatus sufficiently sensitive. To this end, the fiber 25 is preferably wound around the casing of the vacuum bottle over the entire height thereof, or at least over a central portion thereof where the X-radiation is strongest.

The fiber has a diameter of about 0.5 mm so that it fits easily into the annular space 21. It should be noted that the optical fiber is not drawn to scale so as to make it easier for it to be seen.

One end 26 of the fiber is free, and the other end 27 passes through the cover 20 and is connected to an opto-electronic converter device, such as a photo-diode 28. The signal emitted by the photo-diode is amplified and used by devices that are not shown.

The photo-diode is not necessarily placed immediately at the output from the vacuum bottle. In order to avoid attenuation of the signal from the scintillation fiber, an optical fiber 29 made of silica or of transparent plastic may be used between the scintillation fiber and the photo-diode, said fiber being connected via a connector 30.

Figure 2:
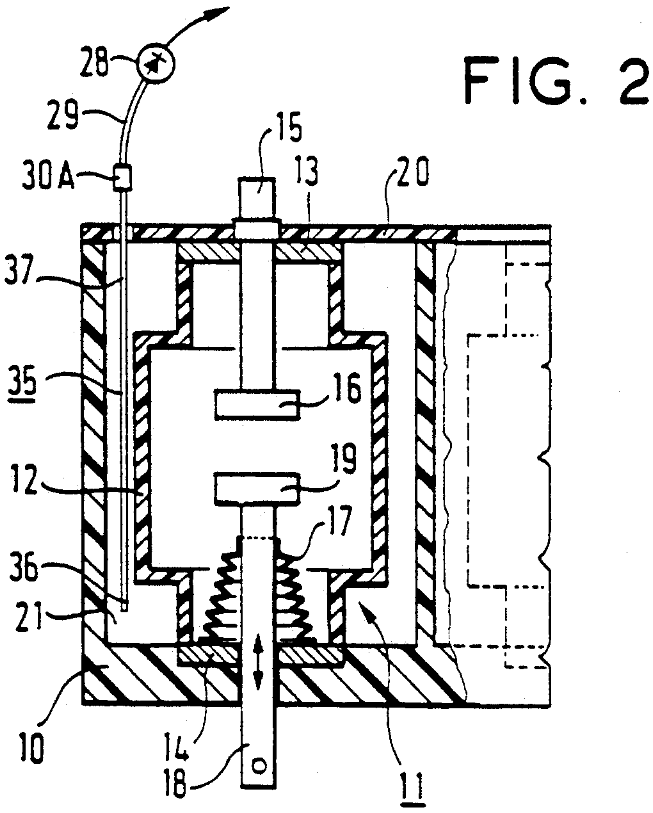
FIG. 2 is a diagrammatic axial section through one pole of a vacuum circuit-breaker in a variant embodiment of the invention.

FIG. 2 shows a variant embodiment of the invention that can be used when the X-radiation from the bottle is very strong. Only one pole of the circuit breaker is shown.

The scintillation fiber 35 whose diameter is close to 1 Åmm, for example, hangs down over the full height of the casing of the bottle. Its free end 36 is close to the bottom of the space 21. Its other end 37 passes through the cover 20, and is connected to a photo-diode 28, optionally via a fiber 29 made of silica or of plastic. The fiber 35 may be made in the form of a strip that is a few centimeters in width. A special connector 30A enables it to be connected to the fiber 29.

With three-phase AC, the voltages of the phases are offset by 60 electrical degrees. At 50 Hz, this offset corresponds to a time offset of 3.3 milliseconds. The radiation emitted by the respective poles, e.g. when a three-phase circuit-breaker is opened, has peaks of intensity that are offset in time by the same value. Therefore, it is possible to use a single scintillation fiber and a single photo-diode, since the electronic apparatus for processing the signal is capable of knowing which peak of the signal should be attributed to which bottle.

Figure 3:
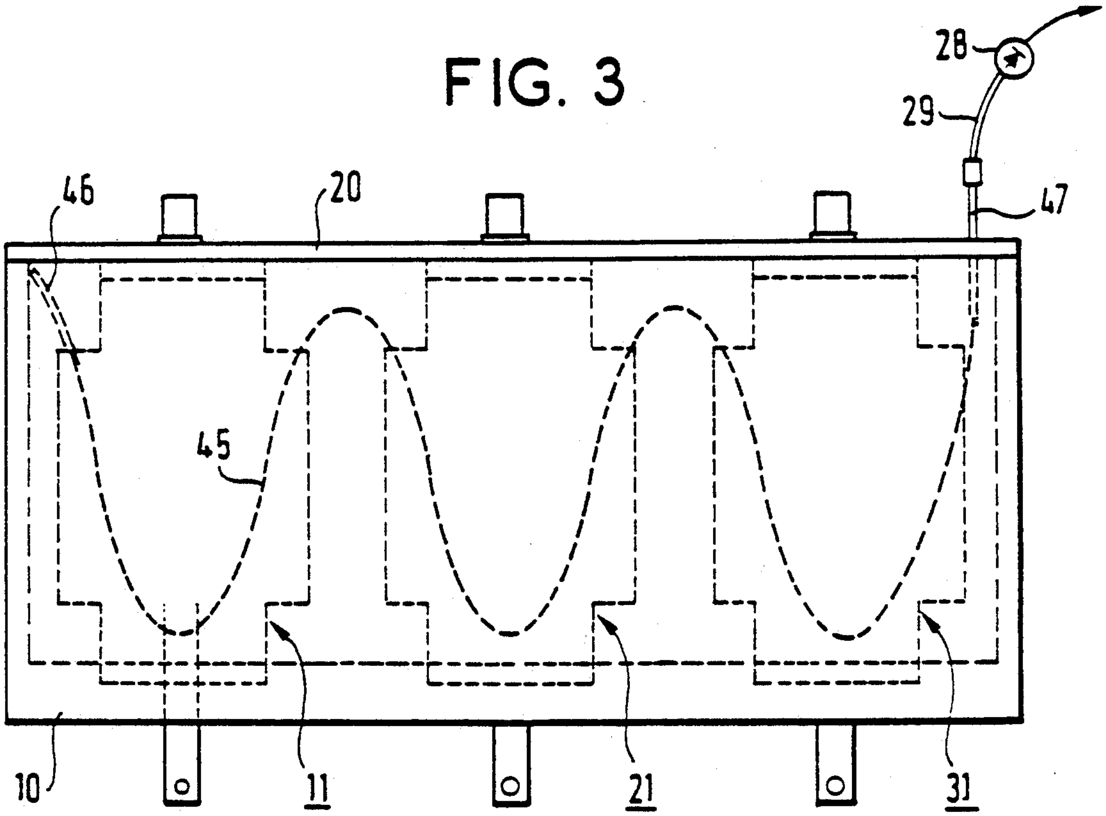
FIG. 3 is a diagram showing a three-phase circuit-breaker in another variant embodiment of the invention.

In practice, as is shown in FIG. 3, a scintillation fiber 45 is used which penetrates into each of the poles and is U-shaped around each bottle. One end 46 is free and finds itself close to the bottle 11, for example, and the other end 47 projects from the pole containing the bottle 31 and is connected to a photo-diode 28 via a fiber 29 made of silica or of plastic. It should be noted that the scintillation fiber must have radii of curvature that are sufficient to avoid attenuating the light wave.

By continuously recording the signals corresponding to the X-radiation, the strength of the signals, and their duration, it is possible to ascertain how the internal state of the vacuum bottles is changing as a function of successive operations. Using suitable photo-diodes covering the wave spectrum of the radiation is more convenient and cheaper than using multiplier phototubes which are expensive but more sensitive.

Some vacuum bottles have a side casing made of transparent or translucent material, e.g. glass.

Figure 4:
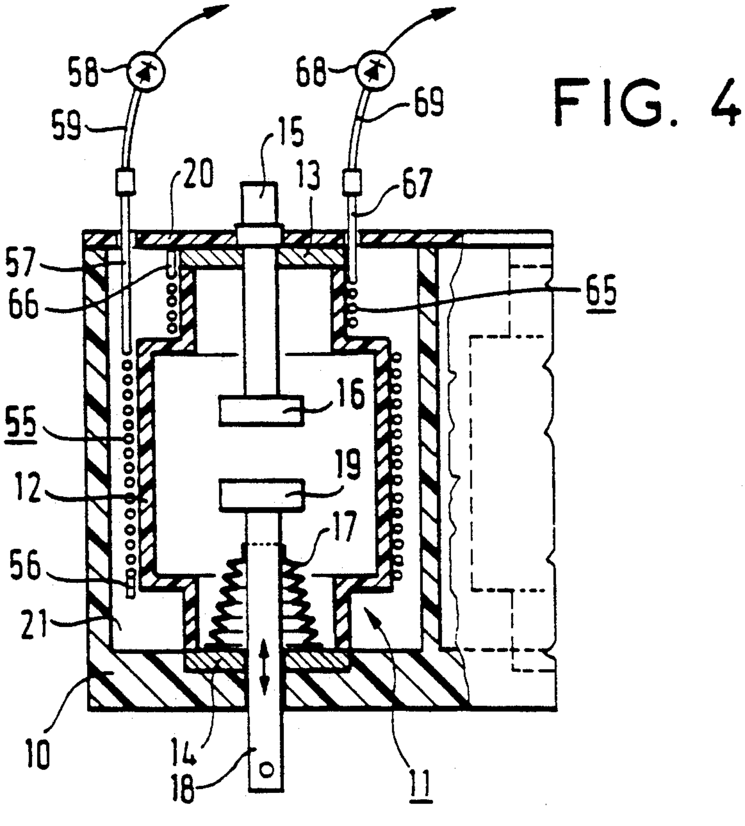
FIG. 4 is a fragmentary diagrammatic elevation view partially in section of a circuit-breaker in another variant embodiment of the invention.

In such apparatus, each pole is equipped with a first fiber 55, of the scintillation fiber type, going round the central portion of the casing 12, as shown in FIG. 4. The fiber is surrounded by an opaque plastic sheath, e.g. black in color, so as to protect it from the action of radiation in the visible spectrum. One end 56 of the fiber is left free. The other end 57 is connected to a photo-diode 58, optionally via a fiber 59 made of silica or of plastic.

The pole is equipped with a second fiber 65, of the fluorescent fiber type, which goes round the top portion (or the bottom portion) of the casing. One of the ends 66 of the fiber 65 is left free, and the other end 67 is connected to a photo-diode 68, optionally via a fiber 69 made of silica or of plastic.

The fiber 65 is used for picking up the visible light from arcing while the circuit-breaker is being opened or closed, which light may give rise to multiple re-arcing. During multiple re-arcing, the duration of the arcing, and therefore of the light emitted, is extremely short, i.e. of the order of a few microseconds for each arc. The fibers used have extremely short response times, e.g. of about ten nanoseconds, and they make it possible to detect such arcing easily.

The circuit-breaker equipped in this way enables both the X-rays and the visible light emitted by the breaking arc to be detected, thereby enabling operation of the apparatus to be diagnosed well.

It should be noted that at least one of the fibers 55 and 65 may be disposed to hang down along the bottle, as is shown in FIG. 2, when the corresponding radiation is sufficiently strong.

When the radiation emitted by the vacuum bottle is weak, too long a scintillation fiber reduces measurement sensitivity, given the high degree of attenuation of the light signal in the fiber. A solution to this problem is offered by the embodiment described with reference to FIG. 5, in which the components that are common to FIG. 5 and to FIG. 2 are given the same reference numerals.

In order to improve radiation detection, the vacuum bottle 12 is surrounded by a scintillation film 70 which then constitutes a cylinder that is about 0.5 mm thick. For example, a scintillation film sold by Nuclear Enterprise under the reference NE102A may be used. In a variant, the scintillation film may be made by means of scintillation fibers disposed to form a cylinder surrounding the bottle. For example, the scintillation fibers may be fibers sold by Optectron under the references S101A or S101D.

The film 70 is surrounded by a fluorescent plastic fiber 65 wound around the film. The fluorescent plastic fiber is connected to a photo-detector 28 via a connector 30A and, if necessary, via an optical fiber 29. The apparatus operates as follows: radiation output by the bottle strikes the film 70 and emits light that is very close to blue light as it passes across the film. Because the film is very thin, a large portion of the light reaches the fluorescent fiber 65 directly without being attenuated. The fluorescent fiber is preferably a fiber that is fluorescent in green light. The fluorescent fiber picks up the light emitted by the film, and in turn emits light which is transmitted to the photo-detector. These dispositions make it possible for the apparatus to offer good sensitivity even with low-level radiation.

Figure 5:
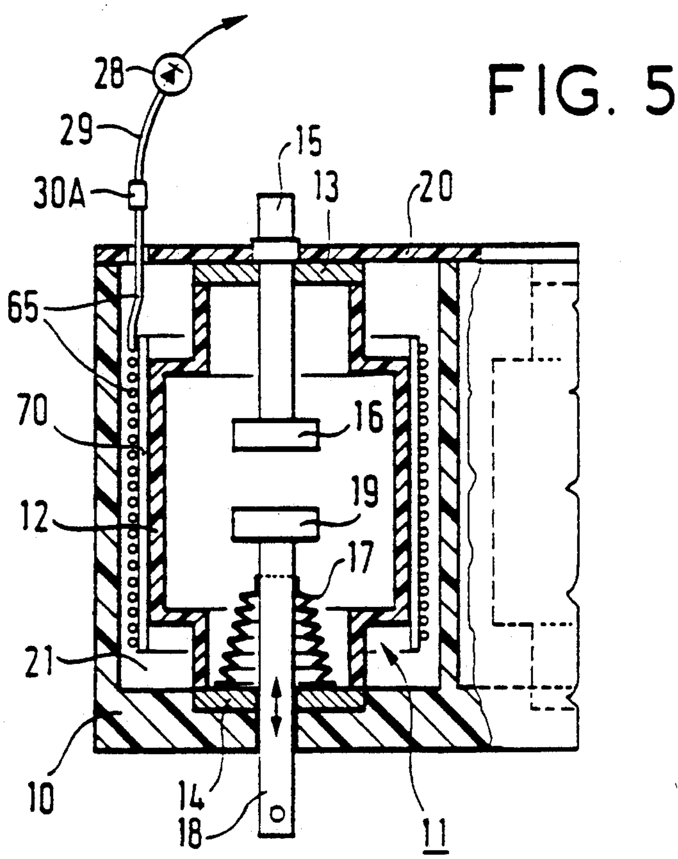
FIG. 5 is a fragmentary diagrammatic elevation view partially in section of a circuit-breaker in another variant embodiment of the invention.
Figure 6:
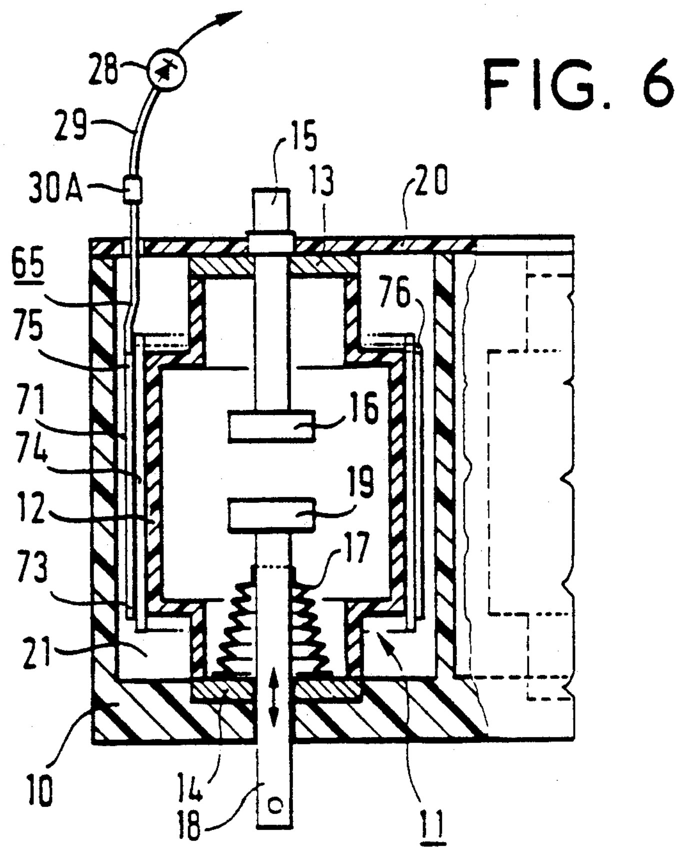
FIG. 6 is a fragmentary diagrammatic elevation view partially in section of a circuit-breaker in another variant embodiment of the invention.

FIG. 6 shows a variant embodiment that is also used to detect low-level radiation. The components that are common to FIGS. 2, 5 and 6 are given the same reference numerals.

The film 70 is replaced by a cylinder 71 formed of scintillation fibers 73 glued to a transparent plastic tube 74 covering the vacuum bottle. The fibers 73 are disposed parallel to each other along generator lines of the tube. The top portion 75 of the cylinder formed by the fibers 73 is in contact with collar 76 constituted by a fluorescent fiber having one of its ends 65 connected to a photo-detector 28.

Radiation output at a point on the vacuum bottle strikes a scintillation fiber 73 and emits light therein, which light propagates to the end 75. The fluorescent fiber 76 wound to form a collar picks up the light and transmits it to the photo-detector 28.

The invention is not limited to the above-described embodiments which are given only to explain the invention. Without going beyond the ambit of the invention, certain means may be replaced by equivalent means.

I claim:

1. A vacuum circuit-breaker including, for each phase, at least one vacuum bottle housed inside a closed enclosure, said circuit-breaker further including at least one scintillation fiber disposed in a space between said enclosure and the outside surface of the vacuum bottle(s), said fiber being connected outside the circuit-breaker to an opto-electronic device, and wherein said scintillation fiber is common to all phases.

2. A circuit-breaker according to claim 1, wherein the casing is made of metal, with the space between the casing and the vacuum bottle being filled with a gas having good dielectric properties.

3. A circuit-breaker according to claim 1, wherein the fiber is cylindrical.

4. A circuit-breaker according to claim 1, wherein the fiber is in the form of a strip.

5. A circuit-breaker according to claim 1, wherein the fiber is in the form of a film.

6. A vacuum circuit-breaker including, for each phase, at least one vacuum bottle housed inside a closed enclosure, said circuit-breaker further including at least one scintillation fiber disposed in a space between said enclosure and the outside surface of the vacuum bottle(s) said fiber being connected outside the circuit-breaker to an opto-electronic device, and wherein said scintillation fiber is wound around a central portion of the vacuum bottle, a first end of the fiber being left free and the other end of the fiber extending out of the enclosure.

7. A vacuum circuit-breaker including, for each phase, at least one vacuum bottle housed inside a closed enclosure, said circuit-breaker further including at least one scintillation fiber disposed in a space between said enclosure and the outside surface of the vacuum bottle(s) said fiber being connected outside the circuit-breaker to an opto-electronic device, and wherein said scintillation fiber hangs down inside the space between the enclosure and the vacuum bottle.

8. A vacuum circuit-breaker including, for each phase, at least one vacuum bottle housed inside a closed enclosure, said circuit-breaker further including at least one scintillation fiber disposed in a space between said enclosure and the outside surface of the vacuum bottle(s) said fiber being connected outside the circuit-breaker to an opto-electronic device, wherein the scintillation fiber is common to all phases, and wherein said scintillation fiber defines a U-shape loop around each vacuum bottle.

9. A vacuum circuit-breaker including, for each phase, at least one vacuum bottle housed inside a closed enclosure, said circuit-breaker further including at least one scintillation fiber disposed in a space between said enclosure and the outside surface of the vacuum bottle(s) said fiber being connected outside the circuit-breaker to an opto-electronic device, and wherein the casing of the vacuum bottle(s) is made of a material that is transparent or translucent, the scintillation fiber is covered with a sheet making it opaque to visible radiation and said circuit-breaker further includes a fluorescent optical fiber.

10. A circuit-breaker according to claim 9, wherein the scintillation fiber is disposed around the central portion of the vacuum bottle(s), and the fluorescent fiber is wound around an end portion of the vacuum bottle(s).

11. A circuit-breaker according to claim 9, wherein at least one of the fibers is disposed so that it hangs down.

12. A vacuum circuit-breaker including, for each phase, at least one vacuum bottle housed inside a closed enclosure, said circuit-breaker further including at least one scintillation fiber disposed in a space between said enclosure and the outside surface of the vacuum bottle(s) said fiber being connected outside the circuit-breaker to an opto-electronic device, and wherein the optical-electronic device is a photo diode.

13. A vacuum circuit-breaker including, for each phase, at least one vacuum bottle housed inside a closed enclosure, said circuit-breaker further including at least one scintillation fiber disposed in a space between said enclosure and the outside surface of the vacuum bottle(s) said fiber being connected outside the circuit-breaker to an opto-electronic device, and wherein the casing is made of an insulating material with a space between the casing and the vacuum bottle being filled with air.

14. A vacuum circuit-breaker including, for each phase, at least one vacuum bottle housed inside a closed enclosure wherein the vacuum bottle is surrounded by a cylinder constituted by a scintillation film, with a fluorescent fiber connected to a photo-detector being wound around said cylinder.

15. A vacuum circuit-breaker including, for each phase, at least one vacuum bottle housed inside a closed enclosure wherein the circuit-breaker includes a plurality of scintillation fibers disposed in parallel to form a cylinder that is coaxial with the vacuum bottle, and a fluorescent fiber disposed to form a collar at one end of said cylinder and facing the ends of said scintillation fibers, one end of said fluorescent fiber being connected to a photo-detector.

16. A circuit-breaker according to claim 15, wherein said scintillation fibers are glued to a transparent tube.

* * * * *